March 28, 1967 B. A. VIZZIER, SR., ETAL 3,311,790

MICROMODULE CONNECTOR AND ASSEMBLY

Filed Feb. 17, 1965 2 Sheets-Sheet 1

INVENTORS
BENTON A. VIZZIER, SR.
LEWIS M. HOOKS
BY Browne, Schuyler & Beveridge
ATTORNEYS March 28, 1967 B. A. VIZZIER, SR., ET AL 3,311,790

MICROMODULE CONNECTOR AND ASSEMBLY

Filed Feb. 17, 1965 2 Sheets-Sheet 2

INVENTORS
BENTON A. VIZZIER, SR.
LEWIS M. HOOKS

BY Brown, Schuyler & Beveridge
ATTORNEYS

United States Patent Office 3,311,790
Patented Mar. 28, 1967

3,311,790
MICROMODULE CONNECTOR AND ASSEMBLY

Benton A. Vizzier, Sr., and Lewis M. Hooks, Huntsville, Ala., assignors to Brown Engineering Company, Inc., Huntsville, Ala., a corporation of Alabama Filed Feb. 17, 1965, Ser. No. 433,331
12 Claims. (Cl. 317—100)

This invention relates generally to a mounting for securing and connecting integrated circuit elements to an etched circuit board. More particularly, it relates to a mounting and heat sink for integrated circuits and micromodules without the use of soldering.

A number of devices have previously been employed for connecting individual circuit components to etched circuit boards, and for interconnecting a number of circuit boards in an electronic assembly. It is also known to provide modular components performing such functions as integration, amplification, differentiation, and various other electronic sub-functions within a single small package, referred to as a micromodule, one form of which is known as an integrated circuit or microcircuit element. Such an element may be of various sizes characteristically less than an inch in maximum dimension including leads for connection to other circuits. By way of example, a flat-packed integrated circuit may have a thickness of .065, a width of .150, and a length including lead strips extending from each side of .50 inch. The width will generally depend upon the number of circuit components required to be included within the microcircuit element and may vary from .10 to .40 inch. An amplifier including diode, resistance and impedance elements may have a volume of .002 cubic inch exclusive of leads for connection to other circuits.

Such circuit elements have heretofore been soldered or welded in place, and present a considerable difficulty whenever it is necessary to test or replace them. Additionally, it has not been feasible to replace any element repeatedly because of the difficulty of remaking connection by soldering or welding due to the destruction or contamination of leads and connecting members. When twenty or more leads per inch of width are to be accommodated, it will be appreciated that usual solderless bindings are not available because of space limitations. It is also to be noted that circuit modules of these dimensions cannot accommodate current within practical means unless means are provided for conducting away the heat generated within such an integrated circuit or circuit module. Practical means for dissipating heat from such circuit elements has not been available, particularly in a module mounting where the module is removable without welded or soldered joints.

It is accordingly an object of this invention to provide a mounting for microcircuit elements providing for connection to a circuit board of the solderless type.

Another object of the invention is to provide a microcircuit element mounting incorporating a heat sink for the dissipation of considerable quantities of generated heat.

Another object is to provide an improved integrated circuit mounting assembly adapted for replaceable attachment to a circuit board wherein a number of circuit elements associated in a function may be attached to the circuit board by bolting or clamping to provide simultaneous connection between the circuit leads and the circuit board conductors.

A further object of the invention is to provide an improved assembly of microcircuit elements on a unitary mounting for attachment to a circuit board including means for conducting heat to exterior heat dissipating structures.

A still further object of the invention is to provide a mounting and connector for integrated circuit elements including spring contact connections to a circuit board with means for variably connecting associated element leads in common to one or more conductors of the circuit board.

These and other objects of the invention will be better understood as the description proceeds in connection with the drawings in which.

Figure 1:
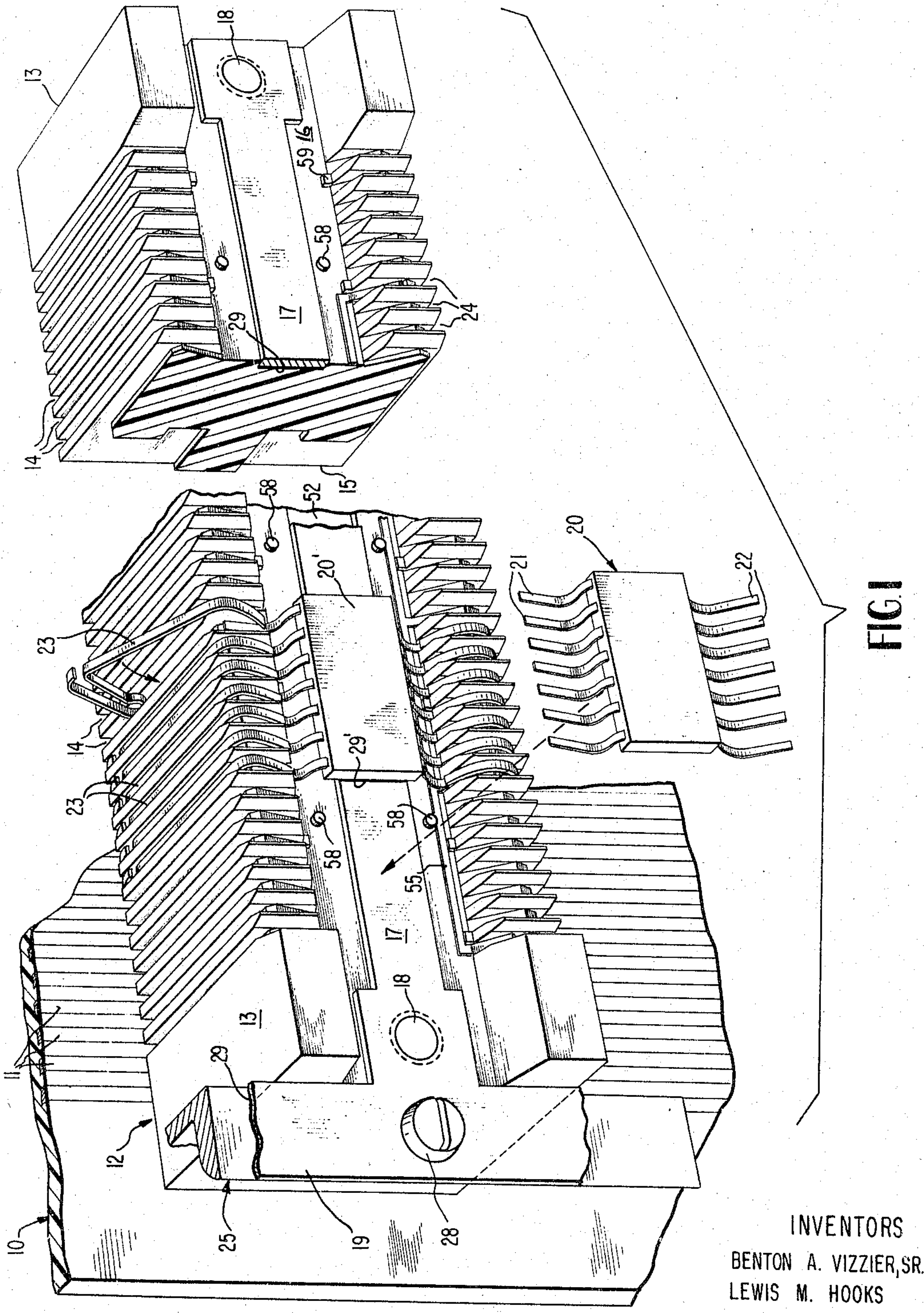
FIG. 1 is a perspective view, considerably enlarged and partially broken away, of a connector assembly according to this invention as attached to a circuit board.
Figure 2:
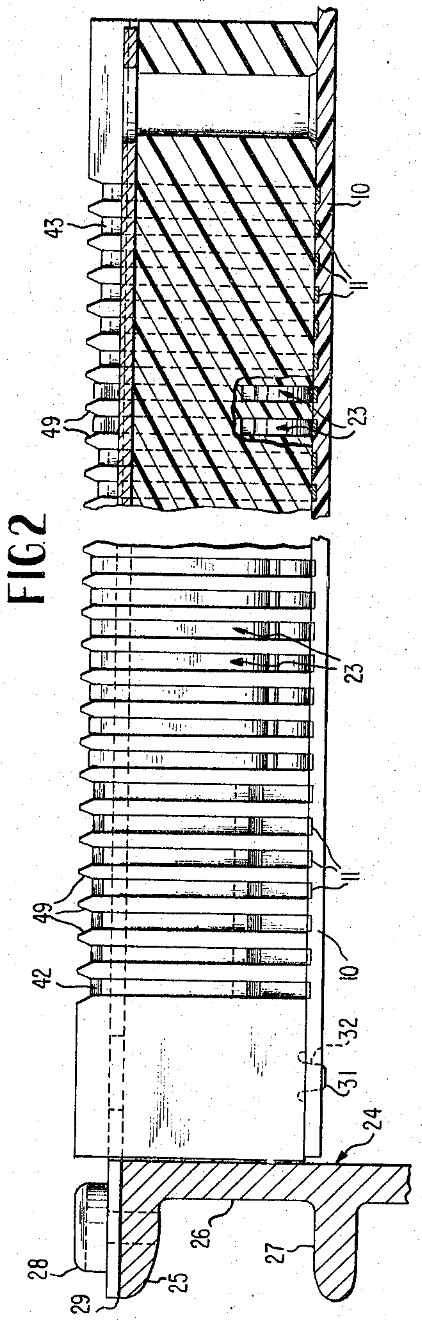
FIG. 2 is a side elevational view of the assembly of FIG. 1, partly broken away.
Figure 3:
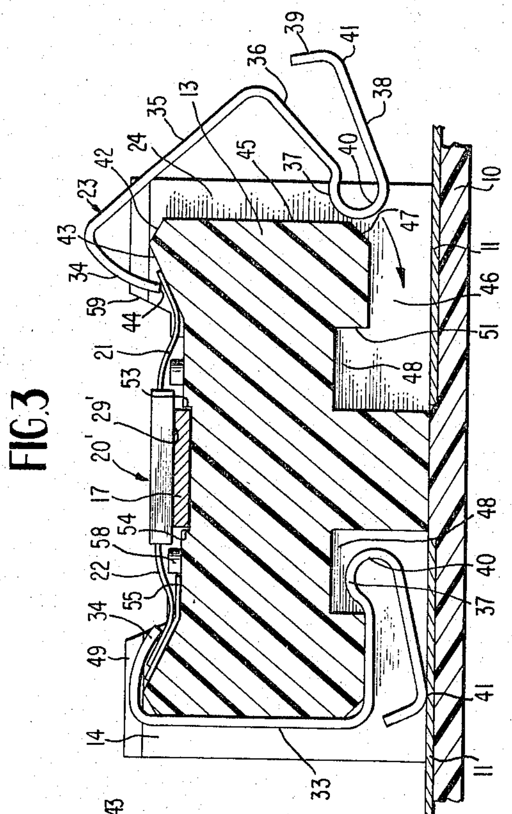
Figure 4:
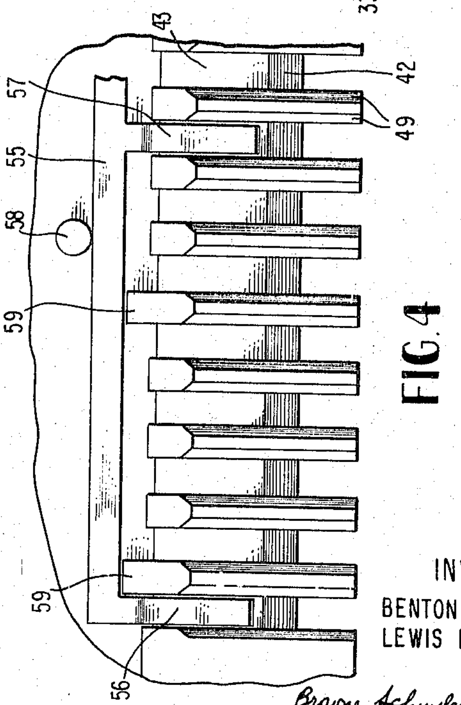

FIG. 3 is a typical cross-sectional view of a mounting as in FIG. 1 showing assembled and partially assembled relationships between contact springs, circuit board shorting bar, heat sink and microcircuit elements; and In FIG. 4 is a further enlarged plan view of a portion of the block of FIG. 1 particularly showing the arrangement of the common bus for interconnecting selected circuit components of adjacent elements.

In achieving the objects of this invention, a mounting and assembly is shown in the drawings by way of illustration for specific embodiments adapted to particular uses in cooperation with external circuitry, but is not limited to the particular form or arrangement of parts, and should be interpreted as applying to equivalent structure having basic features as hereinafter described. A common mounting includes an insulating block provided with transverse receiving slots in which are disposed spring elements engaging both the top and bottom recesses or welled portions at either side of the block and having a spring contact arm for engaging a circuit board to which the block is clamped, while at the same time securing under the upper ends of the springs the corresponding lead strips of the microcircuit elements thereby connected electrically to the circuit board conductors. At the same time a channel is provided in the upper recess of the block for receiving a heat sink strip of suitable high conductivity material, which may also extend to larger heat fins at the ends of the block, and is preferably cemented in place in the recess on the top thereof, and is in thermal engagement with the base of each microcircuit element, preferably including a nonhardening adhesive of high thermal conductivity by which the elements are thermally connected to the heat fins. Paralleling busses or shorting bars may interconnect selected ones of the leads for interconnection of circuit board conductors or for providing a desirable redundancy of connection.

Referring now in detail to FIG. 1, a circuit board is shown generally at 10 having etched conductors thereon as at 11 being generally of the rigid or semi-rigid type capable of supporting a mounting assembly shown generally at 12, comprising insulating block 13, slotted as at 14, and having an otherwise planar bottom 15 and a recess in the upper surface of the block 13 extending the full length thereof in a direction transverse to conductors 11. A heat sink comprising a thermally conductive strip 17 extends along recess 16 to a bolted attachment thereto as at 18, and optionally including heat conducting or radiating web 19 for increasing the heat dissipation from the strip 17. A microcircuit element of the integrated circuit type is shown generally at 20 placed on strip 17 as at 20' and has leads 21 along one side thereof for engagement with slots 14 and leads 22 along the other side thereof for engagement with corresponding slots 24 at the opposite edge of block 13. Web 19 engages a heat radiator consisting of flange 25, web 26, fin 27, being attached thereto as by bolt 28 and a commercial thermally conducting cement as at 29.

A micromodule 20 will normally consist of a number of circuit components encased in glass or plastic, or suitably embedded therein, being preferably arranged for heat dissipation as in the case of semiconductor circuitry requiring a low temperature of operation to avoid destruction of the component. In such a case, the bottom portion of the module 20 is thermally conductive to remove heat from the component through the lower surface thereof in a manner well known in the art and not herein specifically shown. Such a module normally has planar upper and lower surfaces of which the lower surface is to be cemented to strip 17 by a thermally conductive adhesive as at 29′ to provide a heat sink. A suitable cement for this purpose is known in the trade as Wakefield Type 120 and is of a character to retain the module 20 in close thermal contact with strip 17, being preferably a cement of the nonhardening variety so that modules may be removed from strip 17 for replacement whenever this may be desired.

Block 13 may be of a length corresponding to the width of circuit board 10, and is arranged transversely thereto having slots 14 and corresponding like slots 24 at the opposite edge thereof so that each slot 14 and corresponding slot 24 is in alignment with a conductor 11 of the circuit board 10. Block length is variable according to the number of modules 20 to be mounted thereon and in accordance with the number of contacts 21 and 22 required for each module. Simple amplifier circuits may be incorporated in a module having three lead strips 21 and three corresponding lead strips 22, or may include a larger number such as five where other circuit components associated with the amplifier are included in an integrated circuit element. To retain the block 13 in alignment there is preferably provided a plug 31 for engagement with the hole 32 in the circuit board 10 arranged at either end of block 13 or at some central position therein. Circuit board 10 is secured to block 13 by bolting or clamping means not shown. Structure basically as described is a suitable circuit mounting on circuit board 10 for support thereby as a replaceable element within an assembly. The connector assembly of this invention does not require removable circuit boards for the reason that block 13 and all elements mounted thereon as previously described may be readily removed from the circuit board and replaced or repaired as required.

A high quality of insulating material having good dimensional stability and low coefficient of thermal expansion constitutes the body of block 13, being, for example, molded of diallyl pthalate with fiberglass or other suitable reinforcing filler therein. Thermally conducting strip 17 is preferably of beryllium copper, phosphor bronze, or the like, and radiating structures 25, 26, 27 may be of similar material or of aluminum in sufficient size to conduct away the heat generated within the circuit elements. Contact springs 23 are likewise of beryllium copper, phosphor bronze, or the like. Springs 23 and leads 21 and 22 are generally gold-plated to avoid difficulties due to corrosion and to assure low resistive electrical connections therebetween and to conductors 11 of circuit board 10. Leads 21 and 22 are normally supplied in thin ribbon form being deflected to the shape of the underlying structure in the recesses of blocks 13 and in slots 14 and 24 by spring pressure. Contact springs 23 are of substantially heavier material in order to make and retain good contact beneath leads 21 and 22.

As shown more particularly in FIG. 3, block 13 has paired slots 14 and 24 for receiving springs 23 and 33 at either side thereof of which 23 is shown partly installed and 33 fully installed. Each spring includes a hooked upper portion 34 bent inwardly substantially 90° from a straight portion 35 and downwardly at the end thereof in order to clamp lead 21 or 22 to the slot bottom. A further straight portion 36 is bent substantially 90° from straight portion 35 and has a hooked lower portion 37 formed by upwardly bending the end of straight portion 36 and by returning the upwardly bent end through a further bend of approximately 180°, formed in a smooth curve to provide ease of installing the spring 23 in the slot 14. An outwardly extending portion 38 is joined to a portion 39 which together form a spring contact member springedly attached to hook member 37, being primarily bendable about the region 40 which lies beyond the point of engagement between the spring 23 and the bottom of slot 14. A contact bearing point 41 for engaging conductor 11 of board 10 is formed at the juncture between portions 38 and 39 of the contact spring element.

Slot 14 has at the upper surface of the block a bottom formed of a chamfered portion 42 and an inwardly sloped bottom portion 43 suitable for receiving hooked end 34 of spring 23 without engagement with the slot bottom except at the extreme end of the hooked portion at 44 under which is placed one lead 21 from circuit element 20′. Along the side of block 13 the slot extends vertically having inner boundary 45 against which straight portion 35 lies. Slot 14 has a transverse portion 46 leading toward the center of the block and meeting bottom portion 45 at chamfer 47 facilitating insertion of hook portion 37 of the spring. Well portion 48 of slot 14 connects with transverse portion 46 to form a receptacle for hook portion 37 being a deepened portion of the slot extending upwardly from circuit board 10. Installation of springs 23 in slots 14 is facilitated by chamfered sides 49 along the upper barrier portions along each slot 14. Each slot is otherwise of uniform width extending from recess 16 in the upper face of the block laterally around to the well portion 48 adjacent the planar bottom 15 of block 13. Each slot thus formed is of a width slightly in excess of the width of contact spring 23 permitting resilient motion of the spring into engagement with sloped bottom 43 and outer edge of the well portion 48 as at 51. Spring 33 is identical with spring 23 and engages slot 24 which is in all respects like slot 14. So constructed, a contact spring as in 23 and 33 serves as a means of retaining ribbon leads 21 and 22 on the sloped bottoms of slots 14 and 24, and retains the same in position while also firmly engaging slot bottoms as at 43, 45 and 51 so as to be retained firmly in the slot except at contact 41.

Contact portion 41 normally extends below transverse slot portion 46 for engagement with the surface on which the block is secured in any desired manner and positioned as by one or more keys 31.

At the bottom of recess 16 there is formed a channel 52 for receiving heat sink strip 17 and positioning the same with respect to contact springs 23 and 33, preferably being formed with closely fitted edges 53 and 54 for lateral engagement with strip 17 which may be securely cemented therein. Modules 20 may be located in fixed positions along strip 17 and cemented thereto as at joint 29′ previously described. As thus assembled, modules 20 thermally engage strip 17 which in turn thermally engages external radiating structure to dissipate the heat developed in the several modules mounted in block 13.

It is frequently desirable to minimize the number of connections to be brought through circuit board 10, as for example by eliminating certain connections at strips 11. Furthermore, it may be desirable to connect together corresponding leads of several microcircuit elements, or to connect the particular component lead of one element to a different component lead of another element arranged on the same connector assembly. For this purpose, a paralleling bus or shorting bar 55 comprising a gold-plated thin beryllium copper or phosphor bronze strip may be placed along the bottom of recess 16 having connecting arms as at 56, 57 within desired slots 14 or 24 lying on sloped bottoms 43. To maintain the alignment of the paralleling bus there may be provided a series of positioning pins 58 adjacent channel 52 and spaced from the inner edges of the slot walls sufficiently to admit the bus 55 which may further be positioned by a series of shoulders 59 forming extensions of the walled portions between certain of the slots 14 or 24. As so positioned, bus or shorting bar 55 may interconnect like components of the several integrated circuits to permit only a single connection to one of conductors 11, or to provide a redundance where this may be desired. By selective placement of differing busses 55 a variety of connections may be made between various integrated circuits on the same connector assembly. For this purpose bus 55 may be of any length and may have any number of arms 56, 57 as necessary for the purpose.

While we have described and illustrated a preferred embodiment of our invention, we wish it to be understood that we do not intend to be restricted solely thereto, but that we do intend to cover all modifications which would be apparent to one skilled in the art, and which come within the spirit and scope of our invention.

What is claimed is:

1. A connector assembly for circuit modules, comprising an insulating block of elongated form having a planar base portion for transverse mounting on a circuit board in contact with conductors thereon, a plurality of first bottomed retaining slots each extending around a lateral edge of said block from a welled recess in the lower block face above one said conductor into the upper block face having thereat a bottom inwardly sloped from said edge, a connector strip of resilient conducting material in each of a plurality of said slots including a detent portion in said recess and an adjacent spring contact portion normally extending beyond said base portion for making connection with a said conductor therebeneath, and having an upper hook portion engaging said sloped bottom thereby to resiliently engage substantially more than 180° of said slot, a plurality of second bottomed retaining slots similarly disposed about the lateral edge of said block opposite first said slots and similarly arranged to receive contact strips transversely paired with strips of first said plurality, a connector strip in each of a plurality of said second slots similar to first said strips and similarly engaging a said slot, a uniform linear recess in the upper face of said block extending longitudinally therealong for receiving a plurality of like circuit modules each having oppositely paired lead strips for retention beneath opposite said hook portions thereby to complete respective electrical connections to said conductors, said first and second connector strips being dimensioned to mechanically clamp against said sloped bottom lead strips of said modules placed in said recess.

2. A circuit microelement connector assembly, comprising an insulating block having a planar base for engaging at least one circuit board, being elongated to extend transversely across a plurality of circuit board conductors and having a linear recess in the upper face thereof extending along the length of the block, transverse slot means including slots in said block for fixedly poistioning spring connector elements peripherally about said block from said recess to said conductors, including inwardly sloped shoulders adjacent said recess, a spring connector element in each said slot wherein a connection is to be made, including external spring contact means for engaging a said conductor, and hook means for engaging a said shoulder adjacent said recess, and a plurality of like-dimensioned microcircuit components positioned in said recess and each having a plurality of laterally extending leads extending along adjacent said shoulders, respectively, said hook means being tensioned to electrically connect and mechanically retain said leads.

3. An assembly according to claim 2 including a channel adjoining said recess extending beneath a plurality of said microcircuit components, and heat sink means disposed in said channel for thermal contact with said microcircuit components.

4. An assembly according to claim 2 including at least one common connective conductor disposed in said recess and having a conductive arm extending therefrom into each of a plurality of said slots beneath said hook means corresponding to selected connections to a plurality of said leads.

5. An assembly according to claim 2 including at least one common connective conductor disposed in said recess and having conductive arms in contact with corresponding ones of said leads of a plurality of said microelement circuits.

6. A combined microcircuit element mounting and connector, comprising an elongated insulating base having a lower face for engaging a circuit board transversely to conductors thereon, a peripheral slot portion for each said conductor extending from said lower face to an upper face of the base and including a receptacle for receiving a contact element termination above said lower face and an inwardly sloped bottom beneath said upper face, a spring contact element disposed in each of said slot portions having a lower termination in said receptacle and a contact arm extending normally below said lower face for engagement with a said conductor, said element having a hooked upper termination for engaging said sloped bottom, and linear channel means extending along said support between the ends of said slot portions for laterally engaging like microcircuit elements and retaining laterally extending leads therefrom within respective slot portions and beneath said upper terminations.

7. A connector according to claim 6 including bus bar means extending within selected slot portions for interconnecting selected said spring contact elements, said bus bar means being retained in said slot portions by said spring elements.

8. A circuit module connector and heat sink assembly, comprising an insulating support member for mounting transversely to surface conductors of a circuit board, plural slots extending peripherally around lateral portions of said member arranged in opposed pairs for interconnecting aligned circuit board conductors and module leads, a vertical walled longitudinal channel extending along said member between said slots within an upper face of the member, spring contact means for each said slot having hooked upper end members for engaging and retaining thereunder flat leads in said slots, plural circuit module elements disposed in said longitudinal channel having flat leads extended into adjacent slots for engagement with said contact means, and heat sink means arranged within said longitudinal channel for thermal engagement with said module elements, and extending laterally therebeyond.

9. An assembly according to claim 8, said heat sink means being attached to said support, and to each of said module elements by a thermally conductive cement.

10. In a circuit board assembly a microcircuit support, comprising an insulating support including a longitudinal channel dimensioned to engage a plurality of like circuit elements having lateral leads extending therefrom, a plurality of peripheral slots extending from said channel to the reverse side of said support, each dimensioned to receive like spring contact means, and spring contact means in each said slot being tensioned to retain therebelow one said lead and extending from said channel to said reverse side as a protruding contact for engaging a circuit board.

11. In an assembly according to claim 10, a heat sink element extended along said channel for thermal engagement with said circuit elements.

12. In an assembly according to claim 10, including a plurality of said circuit elements disposed in said channel, shorting bar means in said channel having laterally extending arms beneath said spring contact means at selected ones of said slots for engaging like leads of said circuit elements to provide a common connection therebetween.

References Cited by the Examiner

UNITED STATES PATENTS

| | | | |
|---|---|---|---|
| 3,107,319 | 10/1963 | Vizzier | 339—17 X |
| 3,109,958 | 11/1963 | Delachappelle et al. | 317—101 X |
| 3,184,699 | 5/1965 | Spera | 339—17 |
| 3,187,087 | 6/1965 | Katz et al. | 317—100 X |
| 3,187,226 | 6/1965 | Kates | 217—100 |

ROBERT K. SCHAEFER, *Primary Examiner*.

M. GINSBURG, *Assistant Examiner*.